United States Patent [19]

Shichijo

[11] 4,167,702

[45] Sep. 11, 1979

[54] TUNING APPARATUS

[75] Inventor: Hajime Shichijo, Fujisawa, Japan

[73] Assignee: Sony Corporation, Tokyo, Japan

[21] Appl. No.: 910,222

[22] Filed: May 30, 1978

[30] Foreign Application Priority Data

Jun. 3, 1977 [JP] Japan ................................ 52-64905

[51] Int. Cl.² .......................... H04B 1/06; H03J 5/10
[52] U.S. Cl. .................................... 325/455; 74/10.1;
116/241; 325/459; 325/465; 334/87
[58] Field of Search ............... 325/452, 453, 455, 459,
325/468, 465, 464; 334/86–88; 116/241, 254,
255, 259; 74/10 R, 10.1, 10.2

[56] References Cited

U.S. PATENT DOCUMENTS 2,739,232  3/1956  Schwarz .............................. 325/455

Primary Examiner—Marc E. Bookbinder

Attorney, Agent, or Firm—Lewis H. Eslinger; Alvin Sinderbrand

[57] ABSTRACT

A tuning apparatus includes a dial plate marked with broadcast frequencies thereon; guide shafts provided in parallel with the dial plate; a plurality of markers slidably mounted on the dial plate, with each marker representing a preset position and formed with a first engaging portion; a slidable mount member formed with leg portions slidably fitted on the guide shafts, a dial pointer extending from the leg portions to the dial plate to indicate a selected broadcast frequency and catchers or sleeves rotatably mounted on the guide shafts and formed with a second engaging portion, whereby the slidable mount member is driven by a tuning knob such that the first and second engaging portions are brought into engagement with each other in response to the rotation of the guide shafts during the preset mode of operation of the tuning apparatus.

13 Claims, 4 Drawing Figures

TUNING APPARATUS

BACKGROUND OF THE INVENTION

1. Field of the Invention

This invention relates to a tuning apparatus and more particularly to a tuning apparatus which is adapted to preset a plurality of broadcasting stations.

2. Description of the Prior Art

It has been a general practice in presettable radio receivers to select two or more broadcasting stations beforehand, and then select a desired broadcasting station among the preselected broadcasting stations, by depressing a push button or the like.

The general, presettable type radio receivers employ a number of $\mu$-tuning elements corresponding to the number of desired broadcasting stations to be selected. However, these devices are of a complex construction, are difficult to adjust, and are typically high in manufacturing cost.

SUMMARY OF THE INVENTION

It is, therefore, a principal object of the present invention to provide a tuning apparatus which avoids the aforenoted shortcomings encountered with prior art tuning devices.

It is another object of the present invention to provide a tuning apparatus which is simple in construction and adapted to preset two or more broadcasting stations.

It is a further object of the present invention to provide a tuning apparatus which may preset a radio receiver having two or more bands, in a simple and convenient manner.

In accordance with one aspect of the present invention, a tuning apparatus is provided, which includes: a dial plate marked with broadcast frequencies thereon; guide shafts provided in parallel with the dial plate; a plurality of markers slidably mounted on the dial plate, with each marker representing a preset portion and formed with a first engaging portion; a slidable mount member formed with leg portions slidably fitted on the guide shafts, a dial pointer extending from the marker leg portions to the dial plate to indicate a selected broadcast frequency and catcher or sleeve members rotatably mounted on the guide shafts and formed with a second engaging portion, whereby the slidable mount member may be driven by a tuning knob so that the dial pointer and catcher or sleeve members simultaneously move in parallel with the dial plate; and control members for controlling the engagement of the first engaging portion of one of the plurality of markers with the second engaging portion of the catcher or sleeve members in response to the rotation of the guide shafts.

These and other objects, features and advantages of the present invention will be readily apparent from the following description, taken in conjunction with the accompanying drawings which indicate various aspects of the invention.

DESCRIPTION OF THE PREFERRED EMBODIMENTS

Figure 1:
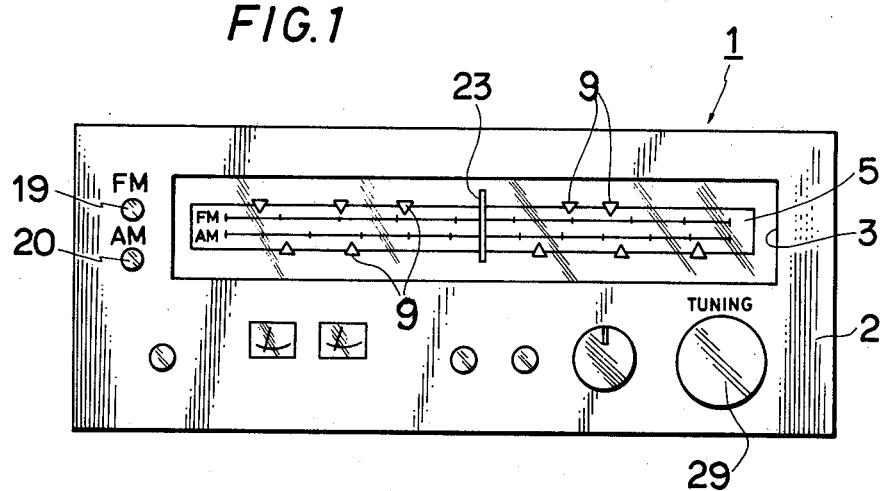
FIG. 1 is a front view of radio receiver employing a tuning apparatus according to the present invention.
Figure 3:
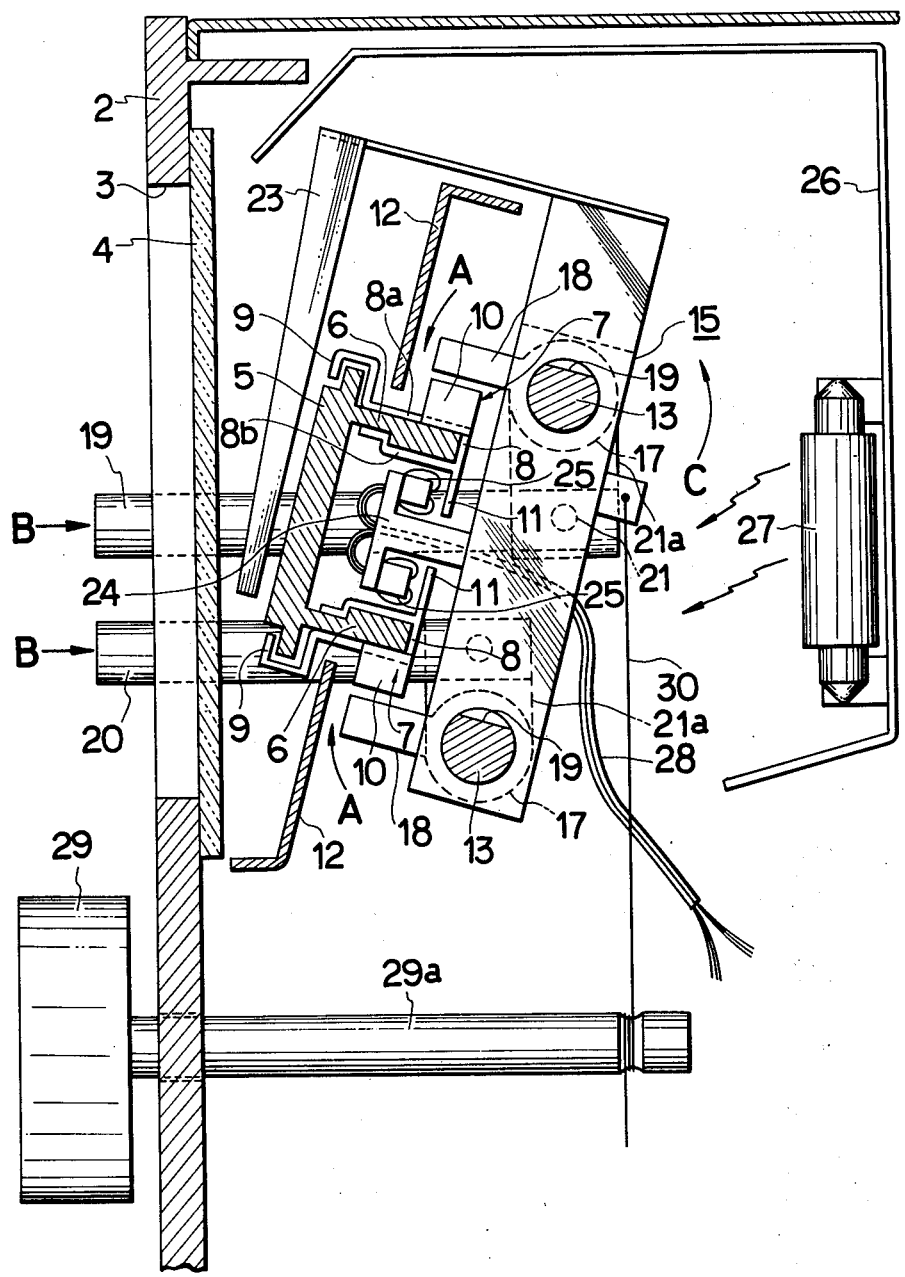
FIG. 3 is a cross-sectional view of the embodiment of FIG. 2, taken along the line I—I thereof.

As seen in FIG. 1, a radio receiver 1 employing the tuning apparatus of the present invention includes a front panel 2 which forms a front wall of a casing of the radio receiver 1. A window 3 is provided in the panel 2 through which a dial plate 5, carrying gradations for indicating the various braodcast frequencies to be picked up, can be seen through the medium of a transparent plate 4 attached to the back of panel 2, see FIG. 3 as well. With reference to FIG. 3, it is seen that dial plate 5 is formed with upper and lower guide rail portions 6,6 which project rearwardly of the casing of the front panel 2 of radio receiver 1. A plurality of markers 7,7 are provided which are slidably movable on the rail portions 6,6 along the length thereof.

Each marker 7 (see FIGS. 2 and 3) includes, by way of example, a marker body portion 8 of a U-shaped cross section and an indicating portion 9 extending toward front panel 2 from one end of an upper side plate 8a. Upper side plate 8a is U-shaped in cross section to fit over dial plate 5 so that indicating portion 9 can be viewed from the front of radio receiver 1 to indicate a desired frequency gradation on dial plate 5. Each marker 7 also includes an engaging portion 10 comprising a pair of upright members 10a formed on the outward side of side plate 8a. Each marker 7 further includes a light shielding plate 11 extending from a root portion 8b of side plate 8a in a direction toward the center of dial plate 5.

Two guide shafts 13,13 are provided which are disposed in parallel with the gradation indicating surface of dial plate 5. Guide shafts 13 are positioned behind dial plate 5 with one in an upper position and the other in a lower position. Upper and lower back plates 12, 12 which are pivotally mounted on side plates 14 are interposed between dial plate 5 and guide shafts 13,13. A pointer mount assembly 15 is fitted on guide shafts 13,13 in a manner so as to be slidably movable therealong in the axial direction of the shafts.

Figure 2:
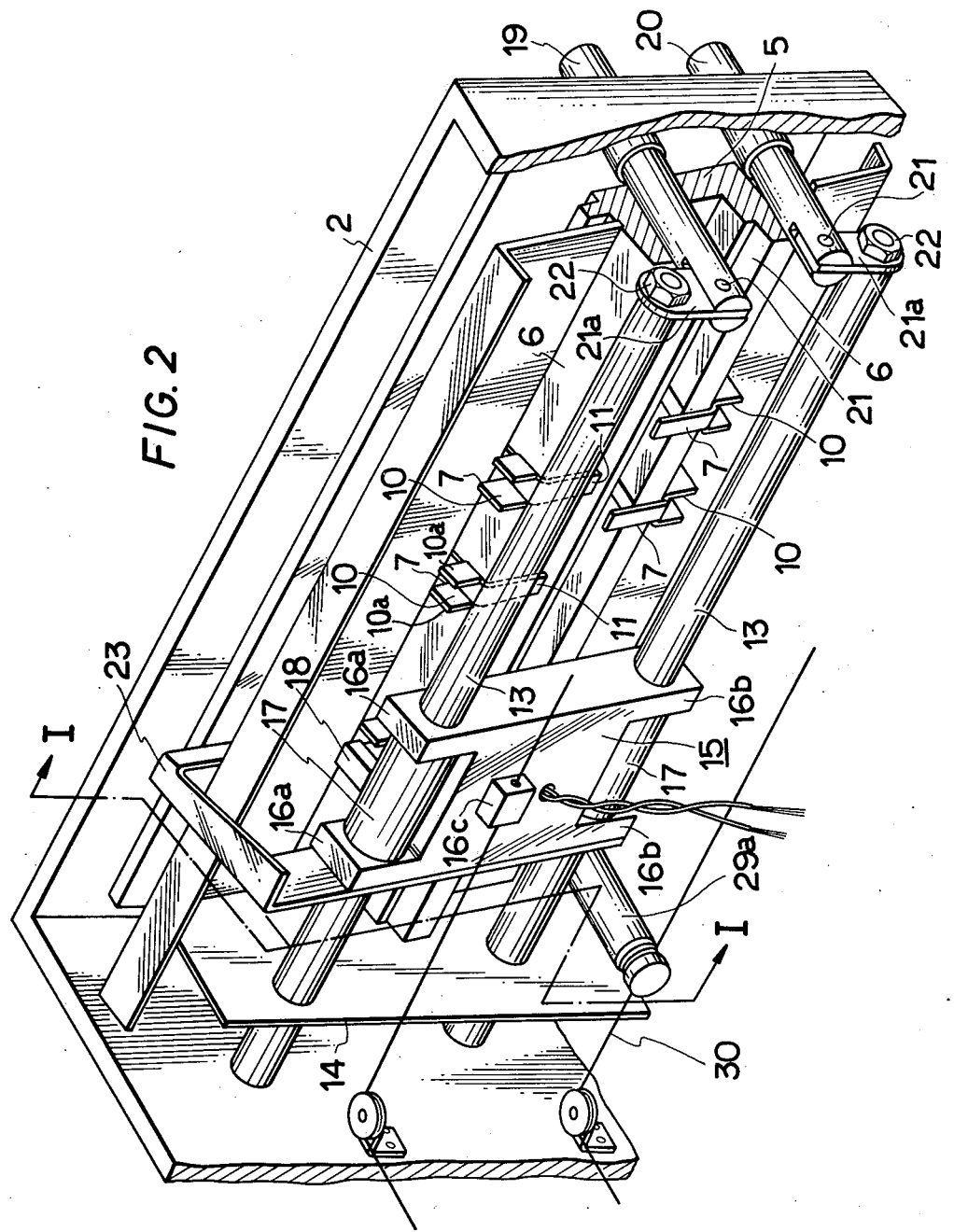
FIG. 2 is a perspective view of one embodiment of the tuning apparatus according to the present invention.

Pointer mount assembly 15, as shown in FIG. 2, is made of a transparent synthetic resin material, shaped in an "H" form, and thus is formed with upper leg portions 16a,16a and lower leg portions 16b,16b, respectively. The guide shafts 13,13 extend through leg portions 16a,16a, 16b,16b, respectively.

Confined between each pair of leg portions 16a,16a, 16b,16b of pointer mount assembly 15 are cylindrical catcher or sleeve members 17,17, respectively. Sleeve members 17,17 are disposed for slidable movement on guide shafts 13,13 along the length thereof. Each sleeve member 17 is provided on its outer periphery with a projecting portion 18, which is adapted to engage, or to be fitted between, the upright pieces 10a,10a constituting the engaging portion 10 of a marker 7. Projecting portions 18 may be any convex shape while upright pieces 10a may be formed in any suitable complimentary concave shape.

The inner peripheral surface of each catcher member 17 is shaped so as to match with a flat portion 19 formed on each guide shaft 13 along the length thereof. In this manner each catcher member 17 is slidable along the length of a guide shaft 13 and will rotate in the direction indicated by the arrow A, as shown in FIG. 3, when the respective guide shaft 13 is rotated. In particular, the catcher members 17,17 are rotated in the direction indicated by the arrows A in response to the operation of push buttons 19 or 20 on front panel 2. Push button 19 is depressed to select FM broadcast bands and pushbutton 20 is depressed to select AM broadcast bands. For instance, when push button 19 for FM is depressed in the direction of arrow B in FIG. 3, then back plate 12 mounted on the side plate 14 is rotated in the direction of arrow A in FIG. 3, through a connecting link 21a having one end pivoted to the shaft 21 of push button 19, and its other end thereof secured to upper guide shaft 13, for example, by means of a nut 22. Guide shafts 13,13 are also mounted on side plate 14, and are pivotable in the direction of the arrow A, so that catcher member 17 is likewise pivoted in direction of arrow A.

Pointer mount assembly 15 is integrally formed with a pointer 23 adapted to indicate a desired broadcast frequency gradation for a station to be received. Pointer 23 also includes a supporting member 24 of a T-shape in cross section, which is disposed between the upper and lower guide rails 6,6. Provided on the supporting member 24 are light receiving elements 25,25 such as phototransistors, which are adapted to receive at all times light beams emitted from a light emitting element, such as a lamp 27, attached to the inner surface of a reflecting plate 26. In FIG. 3, the upper light receiving element 25 is used for FM, while the lower light receiving element 25 is used for AM. A power line 28 runs to the supporting member 24 and is connected to a detection circuit to detect whether or not a light beam from the light emitting element 27 is to be incident on either of the light receiving elements 25,25, depending on whether the radio receiver is in the FM or AM mode.

To select a particular broadcast frequency, a tuning knob 29 is provided on the front of panel 2. A thread 30 to drive the pointer is wound around one end of a shaft 29a of tuning knob 29 and is secured by means of an engaging piece 16c to the back surface of pointer mount assembly 15, as shown in FIG. 2. Accordingly, when tuning knob 29 is turned, pointer mount assembly 15 is slidably moved along shafts 13,13 by means of the thread 30, so that the pointer 23 associated with pointer mount assembly 15 is moved to a position corresponding to the desired frequency to be received. This position is thus appropriately indicated on dial plate 5.

A description will now be provided as to the operation of a broadcasting-station-selecting device and the tuning apparatus according to the present invention.

When tuning knob 29, which is also connected to a variable capacitor through the medium of the thread 30, is rotated in a given direction, pointer mounted assembly 15 is moved along the guide shafts 13,13 thereon, by means of the thread 30 wound around a tip portion of the knob shaft 29a. This movement may be either to the left or right, so that the pointer 23 attached integrally to the pointer mount assembly 15 may be set to one of the markers 7,7 mounted on the upper and lower guide rails 6,6.

The embodiment of the present invention now referred to is designed for a two-band radio receiver for AM and FM broadcasting stations so that when a broadcasting station for FM is desired to be received, the pointer 23 is set to coincide with one of the markers 7 mounted on the upper guide rail 6. The aforenoted series of operations are referred to as the first step herein.

Then, with the pointer 23 being set to one of the markers 7, when a broadcasting station for FM is desired to be picked up, the push button 19 for FM is depressed. The push button 19 is of a self-returning type which allows it to automatically return to its initial or home position under the action of a spring. When the button 19 is depressed in the direction of the arrow B in FIG. 3, the lower end of the link 21a, pivoted to the end of the shaft for the button 19, is also moved in the direction of arrow B in FIG. 3. As a result, upper guide shaft 13 which is rotatably mounted on the side plate 14 is rotated in the direction of arrow C in FIG. 3. When the guide shaft 13 is rotated in this direction, the catcher or sleeve member 17 is also rotated in the direction of the arrow A until the extending portion 18 fits between engaging portions 10a of marker 7. Thus catcher 17 is engaged with a particular marker 7. The aforenoted series of operations are referred to as the second step herein.

After a selected marker has been engaged, tuning knob 29 is rotated. With the catcher member 17 in engagement with the marker 7, because push button 19 is depressed, when the knob 29 is rotated, the pointer mount assembly 15 is moved to the left or right along the guide shafts 13,13. Since one of the markers 7 is now integrally coupled to the pointer mount assembly 15, when the pointer mount assembly 15 is moved to the left or right along the guide shafts 13,13, the marker 7 is also moved to the left or right relative to the dial plate 5 until the engaged marker 7 is set to a position of a desired broadcasting station. The aforenoted series of operations are referred to as the third step herein.

When a marker 7 is accurately set to the position of a desired broadcasting station, push button 19 is released so that the button 19 may be returned to its initial position. Accordingly, in cooperation with the self-returning action of the button 19, catcher member 17 is rotated in a direction opposite to the direction indicated by arrow A in FIG. 3. Thus, the extending portion 18 of catcher member 17 is disengaged from the engaging portions 10a of marker 7. The aforenoted series of operations are referred to as the fourth step herein. These steps are then repeated until all of the markers have been utilized to obtain preselected FM broadcast frequencies.

The markers may also be set in a like manner for preselecting AM broadcast frequencies by moving the pointer mount assembly in conjunction with the push button 20.

With all of the markers set to the positions of desired FM and AM broadcast frequencies as set out in the aforenoted manner, then it is only necessary thereafter that the tuning knob 29 be rotated so as to bring the pointer to the position of a corresponding marker, and then depressing either the push button 19 or 20 depending upon whether an AM or FM station is desired. In this way a desired station may be picked up with ease. The preselected turning apparatus of the present invention thus dispenses with a complicated storing operation to store what station is to be received by depressing a specific push button.

Since the tuning apparatus according to the present invention functions in the aforenoted manner, a light emitting element, for instance lamp 27, and a light receiving element, for instance photo-transistor 25, should be included in radio receiver for the purpose of quickly detecting a preset position of a marker.

Accordingly, in the first step wherein desired markers 7,7 are set to the pointer 23, or when the pointer 23 is brought to a given position of a frequency of a desired broadcasting station, the tuning knob 29 is rotated so as to move the light receiving elements 25,25 on the pointer mount assembly 15 to the positions of the markers 7,7. At this point, the light receiving elements 25,25 which have been maintained in an ON condition by receiving the light beam from the light emitting element 27 may be brought to an OFF condition. Whether or not the pointer 23 is brought to the preset position of a desired marker may be discriminated by electrically detecting the aforenoted OFF condition. A muting circuit or AFC circuit (not shown) provided on an AM or FM receiver may be controlled according to a detection signal thus derived.

Figure 4:
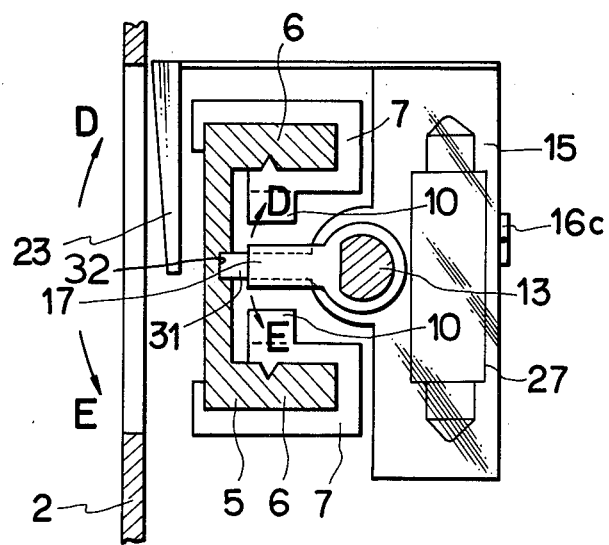
FIG. 4 is a cross-sectional view of another embodiment of a tuning apparatus according to the present invention.

While description has been thus far given of the case where the light emitting element 27 is fixed to the inner surface of a reflecting plate 26, as an alternative, the light emitting element 27 may be integrally provided internally of the pointer mount assembly 15 or externally thereof, thereby moving the light emitting element 27 along with the pointer mount assembly 15 (see FIG. 4). Furthermore, a contacting system employing a pair of contacts may be used for detecting a preset position of a marker, in place of the detecting system employing the light emitting element and light receiving elements, as in the aforenoted embodiment.

FIG. 4 shows another embodiment of the invention for presetting markers to the positions of frequencies of desired broadcasting stations.

In this embodiment, like parts are designated with like reference numerals as used in the description of the first embodiment of the invention.

According to the embodiment shown in FIG. 4, a pointer mount assembly 15 is slidably mounted on a single shaft 13 so as to be movable therealong. In this embodiment, a single catcher member 17 is attached to the pointer mount assembly 15 and is adapted to engage either one of engaging portions 10a,10a of the markers 7,7 which are slidably mounted on upper and lower guide rails 6,6. In this embodiment an extending element 31 of catcher member 17 is slidably disposed within a groove 32 in rail member 6,6 to prevent pointer mount assembly 15 from rotating until a station is selected. With the aforenoted arrangement, catcher member 17 may selectively engage either one of the upper and lower markers 7,7 so that markers may be preset to the positions of the frequencies of desired broadcasting stations. In this embodiment, an operating element (not shown) is secured to the guide shaft 13 in place of a push button, and the operating element is rotated either in the direction of arrow D or E responsive to the selected mode of operation.

As is apparent from the foregoing description of the invention, once a push button is depressed and a tuning knob is operated so as to preset markers in the positions of frequencies of desired broadcasting stations, then a desired broadcasting station may be picked up by simply bringing the pointer to a preset position of a marker by the operation of a tuning knob. In addition, the presetting mechanism is simple in construction, so that the entire size of the apparatus may be rendered compact, thereby providing many advantages such as a low manufacturing cost and adaptability to mass production.

The above embodiments of the invention have referred to a two band system for AM and FM. However, a multiple band system receiver may be provided according to the present invention by increasing the number of the aforenoted combinations of parts.

Although an illustrative embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A tuning apparatus comprising:
    a dial plate marked with broadcast frequencies thereon;
    at least one rotatably mounted guide shaft disposed parallel to said dial plate;
    a plurality of marker means including a first engaging portion slidably disposed with respect to said dial plate with each said marker means being adapted to indicate a predetermined broadcast frequency;
    a mount means slidably disposed for movement on said at least one guide shaft;
    a dial pointer extending from said mount means to said dial plate to indicate a selected broadcast frequency on said dial plate;
    sleeve means slidably and rotatably mounted on said at least one guide shaft, said sleeve means operatively interconnected with said mount means and including a second engaging portion;
    tuning means operatively associated with said mount means, dial pointer and sleeve means to move said mount means, dial pointer and sleeve means along said at least one guide shaft responsive to operation of said tuning means; and
    control means for rotating said at least one guide shaft to move said second engaging portion of said sleeve means from a first position remote from one of said plurality of markers to a second position in operative engagement with said first engaging portion of said one of said plurality of markers, said tuning means in cooperation with said control means being thereby capable of positioning said marker at a predetermined location along said dial plate corresponding to a desired broadcast frequency.

2. A tuning apparatus according to claim 1, further including a guide rail disposed parallel to said dial plate, and wherein said plurality of markers are slidably disposed on said guide rail.

3. A tuning apparatus according to claim 2, in which the first engaging portion of each of said markers is formed in a concave shape and the second engaging portion of said sleeve means is formed in a complimentary convex shape.

4. A tuning apparatus according to claim 1, wherein said control means includes a link mechanism to control the rotation of said guide shaft to initiate the engagement of said second engaging portion of said sleeve means with said first engaging portion of one of said markers.

5. A tuning apparatus according to claim 4, in which said link mechanism comprises an arm which is coupled at one end to said guide shaft and pivotally coupled at its other end to a shaft operatively movable in response to depressing of a push button means.

6. A tuning apparatus according to claim 5, in which said push button means is provided on a front panel of said apparatus and the engagement of one of said markers with said sleeve means is controlled externally of said tuning apparatus.

7. A tuning apparatus according to claim 1, in which at least two sets of a plurality of said marker means are provided for a receiver having different frequency bands.

8. A tuning apparatus according to claim 7, in which one of said set of the markers is provided for an FM frequency band and another of said sets of said plurality of the markers is provided for an AM freqency band.

9. A tuning apparatus according to claim 7, in which a plurality of guide rails are provided parallel to said guide shaft and wherein each of said sets of marker means is slidably disposed on a respective one of said plurality of guide rails.

10. A tuning apparatus according to claim 7, in which a pair of said guide shafts are provided in parallel with said dial plate and a sleeve means is slidably and rotatably mounted on each of said guide shafts.

11. A tuning apparatus according to claim 10, in which one of said sets of marker means is selectively coupled to said sleeve means in response to the selective rotation of one of said guide shafts.

12. A tuning apparatus according to claim 10 or 11, in which said control means includes a pair of link mechanisms which are provided to control the rotation of said guide shafts in opposite directions to initiate the engagement of one of said pair of sleeve means with a selected one of said plurality of marker means on a selected one of said guide shafts.

13. A tuning apparatus according to claim 12, in which each of said link mechanisms comprises an arm which is coupled at one end to a respective one of said guide shafts and pivotally coupled at its other end to a shaft operatively movable in response to selected depressing of push button means.

* * * * *